US011913610B2

(12) United States Patent
Heijmans et al.

(10) Patent No.: US 11,913,610 B2
(45) Date of Patent: Feb. 27, 2024

(54) LIGHTING DEVICE HAVING SOLID STATE LIGHT SOURCE ON BENDABLE PCB

(71) Applicant: SIGNIFY HOLDING B.V., Eindhoven (NL)

(72) Inventors: Martinus Arnoldus Cornelis Heijmans, Veldhoven (NL); Michal Jan Horaczek, Best (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 11 days.

(21) Appl. No.: 17/772,998

(22) PCT Filed: Oct. 20, 2020

(86) PCT No.: PCT/EP2020/079462
§ 371 (c)(1),
(2) Date: Apr. 28, 2022

(87) PCT Pub. No.: WO2021/083733
PCT Pub. Date: May 6, 2021

(65) Prior Publication Data
US 2022/0390076 A1 Dec. 8, 2022

(30) Foreign Application Priority Data
Nov. 1, 2019 (EP) .................................... 19206703

(51) Int. Cl.
*F21K 9/238* (2016.01)
*F21V 29/70* (2015.01)
(Continued)

(52) U.S. Cl.
CPC .............. *F21K 9/238* (2016.08); *F21K 9/233* (2016.08); *F21V 19/004* (2013.01);
(Continued)

(58) Field of Classification Search
CPC .... F21V 23/003; F21V 23/004; F21V 23/005; F21V 29/70; F21V 29/713; F21K 9/238; H05K 1/0278; H05K 1/028
See application file for complete search history.

(56) References Cited

U.S. PATENT DOCUMENTS 6,465,961 B1 * 10/2002 Cao ........................... F21V 3/00
257/E25.02
8,272,762 B2 * 9/2012 Maxik ................... H05K 1/0278
362/249.02
(Continued)

FOREIGN PATENT DOCUMENTS

CN 105526563 A 4/2016
DE 202011104223 U1 11/2011
(Continued)

OTHER PUBLICATIONS https://www.thefabricator.com/thefabricator/article/bending/bending-basics-the-hows-and-whys-of-springback-and-springforward.

*Primary Examiner* — Ismael Negron

(57) ABSTRACT

The light generating device including at least one solid state light source, a monolithic support for the light source with first and second support parts bent relative to each other, and a housing having a housing wall. The light source is supported by the first support part, with the second support part in thermal contact with the housing wall. At least a portion of the support located between the light source and the housing wall is thermally conductive.

14 Claims, 6 Drawing Sheets

(51) Int. Cl.
*F21K 9/233* (2016.01)
*F21V 19/00* (2006.01)
*F21V 23/00* (2015.01)
*H05K 1/02* (2006.01)
*F21Y 105/10* (2016.01)

(52) U.S. Cl.
CPC ............ *F21V 23/005* (2013.01); *F21V 29/70* (2015.01); *H05K 1/0278* (2013.01); *F21Y 2105/10* (2016.08); *H05K 2201/10113* (2013.01)

(56) References Cited

U.S. PATENT DOCUMENTS

| | | | | |
|---|---|---|---|---|
| 8,979,312 | B2* | 3/2015 | Chen | F21K 9/20 |
| | | | | 362/255 |
| 9,664,369 | B2* | 5/2017 | Richards | F21K 9/232 |
| 10,422,485 | B2* | 9/2019 | Bergenek | F21V 3/02 |
| 10,443,795 | B2* | 10/2019 | Bukkems | F21V 23/005 |
| 11,306,876 | B2* | 4/2022 | Garber | F21V 29/86 |
| 2012/0287636 | A1* | 11/2012 | Chen | F21K 9/232 |
| | | | | 362/249.02 |
| 2013/0020941 | A1 | 1/2013 | Breidenassel et al. | |
| 2013/0200410 | A1 | 8/2013 | Kim et al. | |
| 2015/0252990 | A1* | 9/2015 | Liu | H05K 1/0278 |
| | | | | 362/382 |
| 2015/0292726 | A1* | 10/2015 | Den Boer | F21V 29/503 |
| | | | | 313/46 |
| 2015/0354797 | A1* | 12/2015 | Luo | F21V 23/005 |
| | | | | 174/254 |
| 2016/0025276 | A1 | 1/2016 | Fu et al. | |
| 2017/0343163 | A1 | 11/2017 | Eckert et al. | |

FOREIGN PATENT DOCUMENTS

| | | | | |
|---|---|---|---|---|
| GB | 2484152 A | * | 4/2012 | ............ F21K 9/135 |
| JP | 2012089450 A | | 5/2012 | |
| JP | 2013069500 A | | 4/2013 | |
| JP | 2013246894 A | * | 12/2013 | ............ F21K 9/135 |
| JP | 2013246894 A | | 12/2013 | |
| JP | 2014041738 A | | 3/2014 | |
| JP | 2016167436 A | | 9/2016 | |
| TW | 201142198 A | | 12/2011 | |
| WO | WO-2011147644 A2 | * | 12/2011 | ............ F21V 19/005 |
| WO | 2016020782 A1 | | 2/2016 | |
| WO | WO-2016020782 A1 | * | 2/2016 | ............ F21V 23/003 |

* cited by examiner

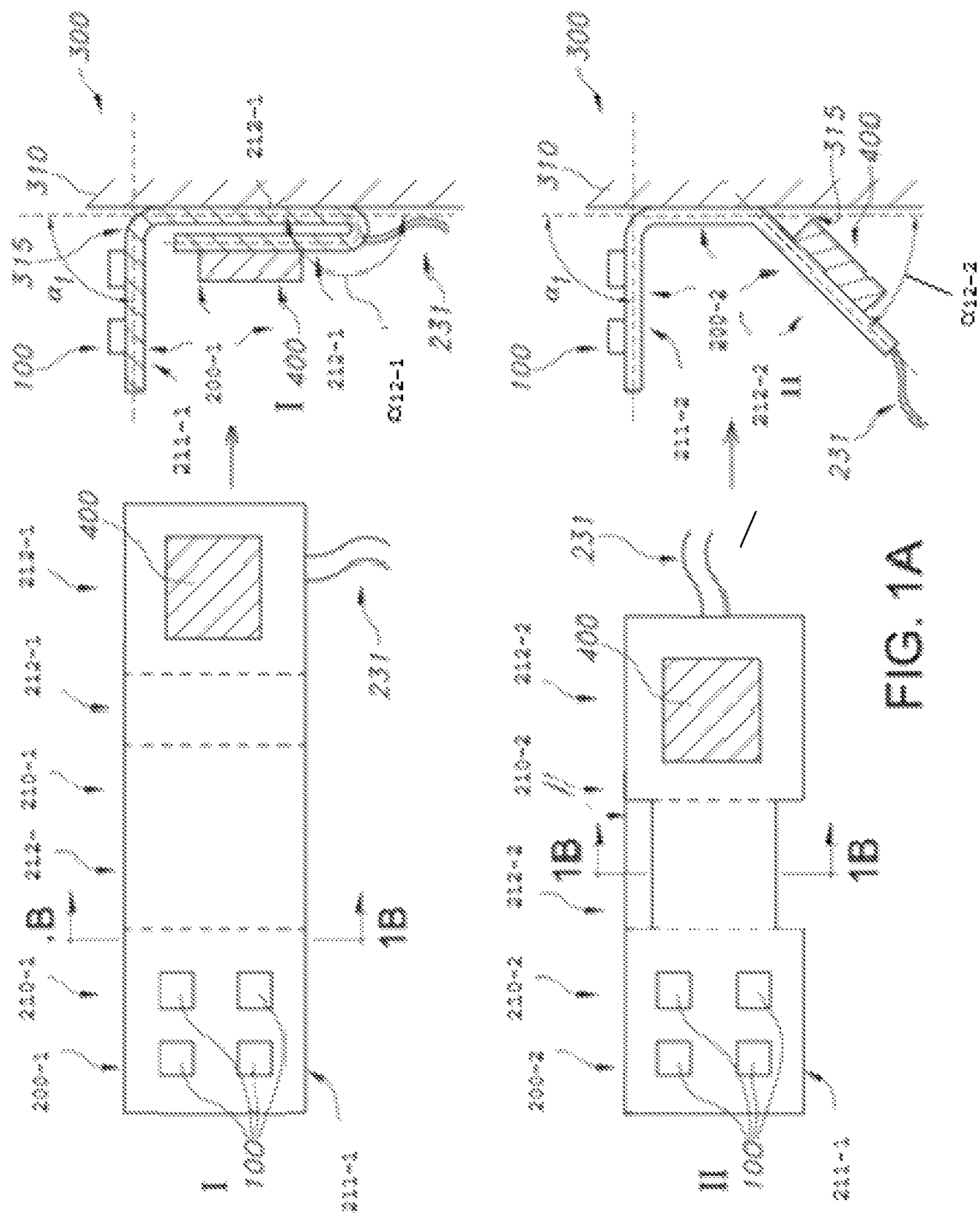

LIGHTING DEVICE HAVING SOLID STATE LIGHT SOURCE ON BENDABLE PCB

CROSS-REFERENCE TO PRIOR APPLICATIONS

This application is the U.S. National Phase application under 35 U.S.C. § 371 of International Application No. PCT/EP2020/079462, filed on Oct. 20, 2020, which claims the benefit of European Patent Application No. 19206703.1, filed on Nov. 1, 2019. These applications are hereby incorporated by reference herein.

FIELD OF THE INVENTION

The invention relates to a light generating device and to a method for producing such light generating device.

BACKGROUND OF THE INVENTION

Light emitting diode spotlights are known in the art. US2016/0027276, for instance, describes a light emitting diode (LED) spotlight comprising a housing, a driver, a cover, a base, an LED substrate, and a lampshade. The housing has an accommodation portion and an opening, the driver is disposed in the accommodation portion, the cover covers the opening. The housing has a plurality of support arms disposed thereon, and the base supports the plurality of support arms. The base has a heat dissipating surface, on which the LED substrate is disposed. The lampshade covers the base and is located on a light-emitting surface of the LED substrate. The distance between the base and the cover is 20-50% of the height of the LED spotlight.

WO2016020782 discloses a support structure for lighting devices, e.g. LED lighting devices, which includes: a non-flat substrate made of a flat laminar member subjected to bending, and an electrical power supply circuit formed on said substrate. The non-flat substrate includes first portions exhibiting bending-induced strain and second portions exempt from bending-induced strain. The electrical power supply circuit is formed at locations of the non-flat substrate which are included in the portions which are exempt from bending-induced strain.

US2013020941 discloses in various embodiments, a semiconductor lamp which may include a driver cavity for accommodating driver electronics, and a light source substrate populated with at least one semiconductor light source, said driver cavity being closed by the light source substrate.

DE202011104223 U1 discloses a lamp with a reflector, with an aligned light flux, which consists of a molded body, an upper base which is provided with a glass cover, wherein a light source is arranged in the interior of the shaped body, which via a power supply is connected to an external cable distributor. The light source has a thermally conductive base which is fastened in the interior of the molded body between the bottom and the glass cover, at least has an LED chip and is provided with circumferential actuating surfaces which can be fastened to the walls of the jacket of the molded body, the at least one LED chip being connected to the power supply which is connectable.

US 2015/292726 A1 discloses relates to a lighting device, comprising at least one light emitting element configured to emit light, a housing having an elongated hollow base portion and a light exit portion, wherein the elongated hollow base portion has a polygonal cross section, and a heat transferring arrangement formed from a folded sheet of a thermo conducting material inserted into and fixed inside of the housing, the heat transferring arrangement comprising a first section onto which the light emitting element is arranged and adapted to receive heat generated from the at least one light emitting element when emitting light, and a second section having an outer surface which once fixed inside of the housing is formed to be in abutment with an inner surface of the elongated hollow base portion of the housing, so that the generated heat is thermally transferred to the housing.

SUMMARY OF THE INVENTION

A lamp design may have a PCB (printed circuit board) based light source that may be glued to a heat spreader and may be attached via a connector to a driver PCB. The heat spreader may be pressed into a lamp housing that may e.g. be made of an overmolded heatsink. Such possible design, however, needs a plurality of components and thus also needs a relatively complicated assembly process. Hence, it is an aspect of the invention to provide an alternative light generating device and/or process for producing such light generating device, which preferably further at least partly obviate(s) one or more of above-described drawbacks. The present invention may have as object to overcome or ameliorate at least one of the disadvantages of the prior art, or to provide a useful alternative.

In a first aspect, the invention provides light generating device ("lighting device" or "device") comprising (i) a light source, (ii) a support for the light source, and (iii) a housing. Especially, in specific embodiments the light source comprises a solid state light source. The housing may especially comprise a housing wall. In specific embodiments, the support comprises at least two support parts which are configured bent relative to each other. In embodiments, a first support part of the at least two support parts is configured to support the light source. Further, in specific embodiments a further support part of the at least two support parts may be configured in thermal contact with the housing wall. In specific embodiments, at least part of the support between the light source and the housing wall is thermally conductive. Further, especially the support is a monolithic support. Hence, especially the invention provides a light generating device comprising (i) a light source, wherein the light source comprises a solid state light source, (ii) a (monolithic) support for the light source, and (iii) a housing comprising a housing wall; wherein the (monolithic) support comprises at least two support parts which are configured bent relative to each other, wherein a first support part of the at least two support parts is configured to support the light source, and wherein a further support part of the at least two support parts is configured in thermal contact with the housing wall, wherein at least part of the support between the light source and the housing wall is thermally conductive.

Such device may comprise less components, as a separate heat spreader may not be necessary. Further, the device may comprise less components as relevant components can be fixated in the housing while these component do not have to be assembled beforehand; all electronic components may be available on the same support, such as an MCPCB (see further also below). Further, with the present device thermal contact with the housing wall may be relatively high. Hence, in a simple way heat from the light source may be dissipated to the housing wall.

Especially, the first support part is associated to a further support part that does not comprise electronic components and that is thermally coupled to the housing wall. In this way, the first support part can transfer heat to the adjacent further support part, which can transfer heat to the housing wall (while not producing heat itself, as it does not comprise a light source or other electronic components). Hence, especially one or more further support parts are associated to the first support part, wherein at least one of these one or more further support parts does not support a light source or (other) electronics.

As indicated above, the light generating device comprising (i) a light source.

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid state light source, such as a LED, or downstream of a plurality of solid state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

In an embodiment, the light generating device may further comprise electronics, wherein the electronics may be physically coupled to the further support part and functionally coupled to the light source.

In an embodiment, the light generating device may comprise at least two further support parts, wherein the at least two further support parts comprise a first further support part and a second further support part, wherein the first further support part is directly associated to the first support part, wherein the second further support part is directly associated to the first further support part and not to the first support part, wherein the first further support part is in thermal contact with the housing wall, and wherein the second further support part is functionally coupled to the electronics. In a further and preferred embodiment, the second further support is not in physical contact with the housing.

In an embodiment, the support has a first major surface and a second major surface opposite to the first major surface, wherein the light source and the electronics may both be arranged on the first major surface. In a further embodiment, the second major surface may not comprise a (further) light source and/or (further) electronics. The obtained effect is a relatively low-cost solution and/or easy to manufacture configuration. For example, only electrodes for powering the LEDs and/or electronics needs to be applied on a single (thus same) surface. The ease of assembly will also improve as the light source and the electronics are arranged on the same surface. Using the abovementioned architecture requires a particular bending of the support such that it fits in and makes good thermal contact with the housing, while the light source emits light in the desired direction and the electronics has sufficient space in the housing. In a preferred embodiment, the second further support carrying the electronics is arranged at the distance from the housing.

In an embodiment, the electronics may further comprise a communication device for control of the light source. Such a communication element is preferably arranged on the second further support part, especially when the second further support part is not in (direct mechanical) contact with the housing. The obtained effect is better sending and/or receiving performance. The reason is that the antenna is arranged at a distance from the housing.

In an embodiment, the first support part and the first further support part may be configured bent relative to each other, and/or wherein the first further support part and the second further support part may be configured bent relative to each other. The obtained effect is to direct the light sources well but also provide sufficient spacing for the electronics. Neighboring parts may, for example, be bent for at least 15 degrees. The second major surface portion of the second further support may even be physically contacting the second major surface portion of the first further support.

In an embodiment, the first support part and the second further support part may be bent in a same direction. The obtained effect is to direct the light sources well but also provide sufficient spacing for the electronics.

In an embodiment the bending angle between the first support part and the first further support part may be different from the bending angle between the first further support part and the second further support part. Specifically, the bending angle between the first support part and the first further support part may be smaller than the bending angle between the first further support part and the second further support part. The obtained effect is to provide more space for the electronics (arranged on the second further support part).

In an embodiment the first further support part is in physical (direct) contact with the housing wall.

In an embodiment second major surface of the first further support part is in physical contact with the housing wall.

In an embodiment the second further support part is not in physical (direct) contact with the housing wall.

In embodiments, the light source is configured to generate white light. In yet further embodiments, a plurality of light sources is applied, which may in an operational mode of the plurality of light sources generate white light. Hence, the device light may in embodiments be white light and may in other embodiments be colored light. Further, in specific embodiments the device light is white light in an operational mode of the light generating device.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

Especially, the light generating device is configured to generate visible light. The terms "visible", "visible light" or "visible emission" and similar terms refer to light having one or more wavelengths in the range of about 380-780 nm. In specific embodiments, the light generating device may also be configured to generate infrared radiation, e.g. for communication (e.g. LiFi).

As indicated above, especially the light source comprises a solid state light source. The light source may in embodiments comprise a luminescent material, configured to convert light from e.g. a solid state light source in luminescent material light. Hence, the device may be configured to generate device light, wherein the device light may comprise one or more of solid state light source light and luminescent material light. The terms "luminescent material" and "luminescent material light", and similar terms, may also refer to different types of luminescent with respective luminescent material light having different spectral power distributions. The luminescent material may be provided as layer on a solid state light source (die) or may be configured remote from the solid state light source (die). As also indicated below, a combination of different embodiments may also be applied.

As indicated above, in embodiments the device may be configured to generate white light. However, in other embodiments the device may be configured to generate colored light. When the device comprises a plurality of light sources, which may in embodiment essentially be the same light sources and which may in other embodiments comprise different light sources, the light source may also be controlled, i.e. especially solid state light source may be controlled. To this end, the device may comprise a control system, which may be supported by the support, or the device may be functionally coupled to a control system.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the control system, but may be (temporarily) functionally coupled to the control system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

Further, the device comprises a support for the light source. The support comprises at least two support parts least two support parts. Especially, the support is a monolithic support. Hence, the first support part and the one or more further support parts may be comprised by a single body; however, two or more of the parts may have mutual angles unequal to 180°, as they may be configured bent relative to each other.

In embodiments, a first support part of the at least two support parts is configured to support the light source. The term "first support part" may in specific embodiments also refer to a plurality of (different) first support parts.

In further embodiments, a further support part of the at least two support parts is configured in thermal contact with the housing wall. The term "further support part" may in embodiments also refer to a plurality of further support parts. At least one of the further support parts may be configured in thermal contact with the housing wall. Further, at least one first support part and at least one further support part are configured bent relative to each other. When there more than one first support parts and/or when there are more than one further support parts, in embodiments all further support parts may be configured bent relative to one or more first support parts. Especially, when there are two or more further support parts, at least two of them, may be in thermal contact with the housing wall.

Especially, the term "thermal contact" may refer to an average distance of at maximum 100 µm, even more especially at maximum 50 µm, such as yet even more especially at maximum 20 µm. The smaller the average distance, the better the thermal contact is. With full physical contact, thermal contact may be best. As indicated above, a further support part may be in thermal contact with the housing wall (or internal planar contact part comprised thereby). Especially, at least 20%, such as at least 50%, like even more especially at least 80% of such further support part may be in thermal contact with the housing wall. Further, especially at least 4 mm$^2$, like even more especially at least 16 mm$^2$, may be in thermal contact with the housing wall (or internal planar contact part comprised thereby). Even more especially, at least 20%, such as at least 50%, like even more especially at least 80% of such further support part may be in physical contact with the housing wall. Further, especially at least 4 mm$^2$, like even more especially at least 16 mm$^2$, may be in physical contact with the housing wall (or internal planar contact part comprised thereby). Larger values, however, may also be possible. Here, the percentage refer to the percentage of the surface (of one side of the support) that is in thermal or physical contact with the housing wall. Instead of the term "physical contact" also the term "mechanical contact" may be used. In especially refer to two items that touch each other.

As indicated above, the first support part and the further support part are configured bent relative to each other. This may especially indicate that the first support part and further support part are essentially comprised by a monolithic body but the two parts can be bent relative to each other. More precisely, in the light generating device the first support part and further support part are configured bent to each other. Hence, instead of an angle of 180°, the first support part and further support part are configured under an angle unequal to 180°. When the first support part and the further support part are in a planar configuration, i.e. not bent, the mutual angle may be 180° and the bending angle is 0°. Further, the bending angle when bent relative to each other is thus in general not 0°, but in general within the range of larger than 0° and equal to or smaller than 180°. In specific embodiments, the bending angle is equal to or larger than 15, such as e.g. equal to or larger than 45°, such as equal to or larger than 60°. Hence, especially the bending angle is the angle deviating from a planar (180° configuration of two support parts.

A mutual angle ($\alpha$12-1 or $\alpha$12-2, collectively $\alpha$12) between two further support parts may be selected from the range of 0-360°, including in embodiments 180°. Hence, they may be bent or unbent, dependent upon the desired configuration.

In specific embodiments, the support comprises a metal-core printed circuit board (MCPCB). Especially in this way, at least part of the support is thermally conductive. Here, it is especially referred to the metal core. The metal core may e.g. aluminum metal. Alternatively, the metal core may be copper metal.

State of the art PCBs are e.g. FR4 PCBs, which are made of epoxy resin plus filler (filler) and glass fiber. Aluminum substrate or copper substrate PCB (also MCPCB) is a kind of PCB, metal based printed board, with a high thermal conductivity and a good heat dissipation function. The general single layer MCPCB may be composed of three layers of structure, which are the circuit layer (copper foil), the insulating layer and the metal base. Used for high-end use is also designed as a double-sided plate, the structure of the circuit layer, insulation layer, aluminum or copper, insulation layer, circuit layer. Very few are used as multi-layer layer, which can be made up of ordinary multilayer with insulating layer and aluminum base (or copper base).

As at least one further support part is in thermal contact with the housing wall, and as the light source if especially physically coupled to the first support part, heat can be transferred from the light source via the first support part and via one or more further support parts to a further support in thermal contact with the housing wall. Hence, at least part of the support between the light source and the housing wall is thermally conductive. The first support part in thermal contact with the housing wall is especially in physical contact therewith. This may be facilitated by the bending of the support (see further also below).

As indicated above, the housing comprising a housing wall. Instead of the term "housing wall", also the term "device wall" may be applied. The housing may especially be polymeric material or ceramic material. Though with the present invention not necessary, the housing wall may also comprise an overmolded heatsink.

As indicated above, the light source may comprise a solid state light source. For this reason, but in other embodiments also for other (control) reasons, the light generating device may further comprising electronics. In embodiments, the electronics comprise a driver. Alternatively or additionally, in embodiments wherein the electronics further optionally comprise a communication device for control of the light source. Such communication device may be based on e.g. Bluetooth, Wifi, LiFi, etc. (see also above). Especially, in embodiments the electronics are physically coupled to the further support part. Yet further, especially the electronics are functionally coupled to the light source. This functional coupling may especially imply that the electronics and the light source are in the same circuit (comprised and/or supported by the support, such as the MCPCB).

Herein, instead of the term "electronics" also the term "electronic component" may be applied. The electronic component may include an active or a passive electronic component. An active electronic component may be any type of circuit component with the ability to electrically control electron flow (electricity controlling electricity). Examples thereof are diodes, especially light emitting diodes (LED). LEDs are herein also indicated with the more general term solid state lighting devices or solid state light sources. Hence, in embodiments the electronic component comprises an active electronic component. Especially, the electronic component may comprise a driver. Other examples of active electronic components may include power sources, such as a battery, a piezo-electric device, an integrated circuit (IC), and a transistor. In yet other embodiments, the electronic component may include a passive electronic component. Components incapable of controlling current by means of another electrical signal are called passive devices. Resistors, capacitors, inductors, transformers, etc. can be considered passive devices. In an embodiment, the electronic component may include an RFID (Radio-frequency identification) chip. A RFID chip may be passive or active. Especially, the electronic component may include one or more of a solid state light source (such as a LED), a RFID chip, and an IC. The term "electronic component" may also refer to a plurality of alike or a plurality of different electronic components. Herein, the terms "electronics" or "electronics" may especially not refer to a (solid-state) light sources, as these are addressed as such.

As indicated above, the light generating device may comprise a plurality of further support parts. At least one is configured in thermal contact with the housing wall. When there are a plurality of further support parts, one or more of these may be configured in thermal contact with the housing wall. In specific embodiments, the plurality of further support parts are configured in thermal contact with the housing wall.

One or more of the plurality of further support parts may comprise electronics. In specific embodiments, one or more may comprise electronics, and one or more may not comprise electronics. Especially the latter may be configured in thermal contact with the housing wall. Hence, in specific embodiments the electronics may be physically coupled to a subset of the plurality of further support parts. The number of further support parts may be limited. Some support parts may be used for thermal contact with the housing wall. Others may solely be applied as intermediate support part. Such further support parts may facily bending and/or configuring of the support in the housing. Other further support parts may essentially only have the function of hosting electronics. Hence, in specific embodiments the light generating device may comprise 2-8 further support parts. Especially, in embodiments at least two of the further support parts are directly associated to the first support part (and not via another further support part. Hence, two or more further support parts may be directly associated to the first support part. In specific embodiments, all further support parts may be associated to the first support part. In yet further embodiments, 2-4 further support parts are directly associated to the first support part and 2-4 further support parts are associated to the first support part only via one or more other further support parts. Instead of the term "directly associated" also the term "adjacent" may be used. Further, in general the term "associated" in the context of support parts may refer to an adjacent arrangement of the support parts, unless indicated that they are associated to another support part only via yet another (further) support part.

In specific embodiments, the light generating device may comprise at least two further support parts, wherein a further support part (directly) associated to the first support part may be in thermal contact with the housing wall, whereas a further support part not directly associated to the first support part but associated to the further support part directly associated to the first support part may be functionally coupled to the electronics. Hence, in specific embodiments the light generating device may comprise at least two further support parts, wherein the at least two further support parts comprise a first further support part and a second further support part, wherein the first further support part is directly associated to the first support part (and directly associated to the second further support part), wherein the second further support part is directly associated to the first further support part and not to the first support part, wherein the first further support part is in thermal contact with the housing wall, and wherein the second further support part is functionally coupled to the electronics. In yet further embodiments, there may be two or more sets of such first further support part and second further support part, wherein each first support part (of a set) is associated to the first support part, and each second further support part (of a set) is associated to such first further support part and not associated to the first support part.

In specific embodiments, a plurality of light sources may be functionally coupled to the first support part. For instance, 4-100 solid state light source may be functionally coupled to the first support part. In specific embodiments, the first support part has a circular shape. Especially, in such embodiments also the housing may have a circular cross-sectional shape. Hence, in specific embodiments the light generating device comprises a plurality of light sources, wherein (in embodiments) the first support part has a circular shape, and wherein the first support part is configured to support the plurality of light sources.

Especially, the one or more light sources are functionally coupled to the first support part (and not physically coupled to the further support parts). In specific embodiments, there is a single first support part comprising one or more light sources. In yet further specific embodiments, the support may comprise two or more first support parts, each comprising one or more light sources. Hence, the term "first support part" may in specific embodiments also refer to a plurality of first support parts. As indicated above, especially each first support part may be adjacent to a further support part (that is in thermal contact with the housing wall) without electronics. In yet specific embodiments, such further support part (in thermal contact with the housing wall) may be shared by two or more first support parts.

As indicated above, the further support part is in thermal contact with the housing wall. More especially, the further support part is in physical contact with the housing wall. Would there be more than one further support part, at least one is in thermal contact, such as physical contact, with the housing wall.

The housing may include one or more elements that allow physical contact between the further support part and the housing wall. For instance, the housing wall can may include one or more protruding elements. Such protruding element may have a surface area essentially identical or larger than the surface area of the further support part which is (to be) in thermal contact, such as physical contact, therewith. In this way, thermal contact can essentially be guaranteed. The protruding element may be of the same material as the housing wall, or may comprise a material that has a thermal conductivity of at least the housing wall material or larger. For instance, when the housing wall includes an overall curved internal surface, protruding element may provide an essentially planer surface in the cavity of the housing (wall). Hence, in this way the protruding element may provide a planar contact part (for the further support part). Hence, in embodiments the housing wall may comprises an internal planar contact part, wherein the further support part is in physical contact with the internal planar contact part. When more than one further support part should be in thermal contact with the housing wall, there may also be more than one planar contact parts.

Physical contact may especially be facilitated by the fact that the support may be resilient. Especially when a metal-core PCB is applied, the further support part may be bent in such a way, that it exerts a force to the housing wall (or to the planar contact part). Hence, the support may thus be bendable, in the sense that at least the further support part and the first support part may be bent relative to each other. Further, especially the further support part and first support part may provide a resilient bent. Hence, in specific embodiments the first support part and the further support part are configured under a first angle ($\alpha_1$) larger than a predefined bent angle ($\alpha_B$). In specific embodiments the first angle ($\alpha_1$) may be selected from the range of 0.5-20°, especially, 1-20°, such as especially 2-10°, larger than a predefined bent angle ($\alpha_B$). Smaller angles may exert less force by which the thermal contact may be less. Larger angles may exert too much force or may lead to overbending. The first angle $\alpha_1$ may also be indicated as bending angle, and is zero when the first support part and associated further support part are unbent relative to each other.

Especially, the first angle $\alpha_1$ may in specific embodiments be selected from the range 15-165°, even more especially 35-145°, such as larger than 90°. The first angle is especially defined relative to a plane parallel to the first support part, wherein the first angle defines the angle the further support part deviates from a planar configuration of the first support part and the further support part.

Similarly, the mutual angles between further support parts may be determined. Note that when there are more than two support parts, possible angles of subsets of two adjacent support parts may not all necessarily be in the same plane. Further, whereas in specific embodiments of the light generating device the mutual angle of the first support part and an adjacent further support part may in embodiments not be 180° (i.e. in embodiments unbent), such as the first angle being selected from the range 15-165°, a similar mutual angle between two (adjacent) further support parts may essentially have any angle.

In embodiments, the configuration of the housing may be such that only by bending the support may be configured (and fixated) in the housing, especially also under the desired first angle. For instance, this may be facilitated in embodiments wherein the housing wall defines an opening, wherein the first support part is configured at the opening, and wherein the housing wall and a plane (P) parallel to the opening define a second angle ($\alpha_2$) larger than the predefined bent angle ($\alpha_B$). For instance, the housing may have over at least part of its length have a pyramidal or conical shape.

When there are a plurality of further support parts, one or more support parts directly associated to the first support part may be configured bent relative to the first support parts. When there are also further support parts that are associated to the first support part only via a further support part, the further support parts (directly) associated to each other may also be configured bent to each other (see above conditions which may also apply). However, this is not necessarily the case.

Hence, the support may in embodiments e.g. be press fit in the housing. For (further) fixation of the support, it may be beneficial to use fixating elements. For instance a first mechanical connector may slide in a second mechanical connector and be fixated. A first mechanical connector or second mechanical connector may comprise a barb, and when slided to each other, one may be fixated to the other. Hence, the housing (wall) and the support may each have a mechanical connector, which may be supplementary, to provide a connection. Hence, in embodiments the housing and the support comprise one or more male-female connections, wherein the support comprises one or more first mechanical connectors, wherein the housing comprises one or more second mechanical connectors. Especially, the one or more first mechanical connectors and the one or more second mechanical connectors provide one or more male-female connections. The mechanical connector may comprise snapper elements. The physical connector may essentially be used to provide a fixation.

In yet a further aspect, the invention also an element comprising a solid state light source and a support for the light source, wherein the support is especially a monolithic support, wherein the support comprises at least two support parts which are configurable bent relative to each other, wherein a first support part of the at least two support parts is configured to support the light source, wherein at least part of the support is thermally conductive. Especially, the element comprises a PCB, more especially a metal-core PCB, to which the solid state light source is functionally coupled. Hence, the support may comprise a metal-core printed circuit board. Especially, the first support part and the further support part are configurable under a first angle ($\alpha_1$) (or bending angle) larger than a predefined bent angle ($\alpha_B$), wherein in specific embodiments the first angle ($\alpha_1$) may be selected from the range 35-145°. Hence, the first support part and the further support part may have a predefined bent angle ($\alpha_B$) (which is especially unequal to 0°). The support may be provided planar, but may thus be bent as described herein. Further embodiments of the support described herein in relation to the light generating device may also apply to element per se. The element may thus be a MCPCB with at least a solid state light source.

In yet a further aspect, the invention also provides a method of producing the light generating device as defined herein. Especially, in embodiments the method comprises providing a light source, a support for the light source, and a housing comprising a housing wall, wherein the support in embodiments comprises at least two support parts which are bendable relative to each other, and wherein a first support part of the at least two support parts is configured to support the light source. Further, the method may comprise bending the at least two support parts. During bending or after bending, the method may further comprise introducing one or more of the at least two support parts in the housing wall. Further, especially in embodiments the method may also comprise fixating the support to the housing. Amongst others, the above mentioned force and/or the above-mentioned mechanical connector elements may be applied. Yet further, the method may comprise configuring at least one further support part in thermal contact with the housing wall. The above-mentioned features of the method may be executed in one or more stages. For instance, the bending may be executed in a first stage, and introducing, fixating, and configuring in thermal contact may be executed in a second stage. Further, as indicated above, at least part of the support between the light source and the housing wall may especially be thermally conductive. Hence, in a specific embodiment the invention provides a method of producing the light generating device according to any one of the preceding claims, wherein the method comprises: (a) providing a light source, a support for the light source, and a housing comprising a housing wall, wherein the support comprises at least two support parts which are bendable relative to each other, wherein a first support part of the at least two support parts is configured to support the light source; and (b) bending the at least two support parts, introducing one or more of the at least two support parts in the housing wall, fixating the support to the housing, and configuring at least one further support part in thermal contact with the housing wall, wherein at least part of the support between the light source and the housing wall is thermally conductive.

The light generating device may have a retro shape. For instance, the light generating device may be a retrofit lamp.

The light generating device (or lighting device) may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1d schematically depict some embodiments.

Figure 1B:
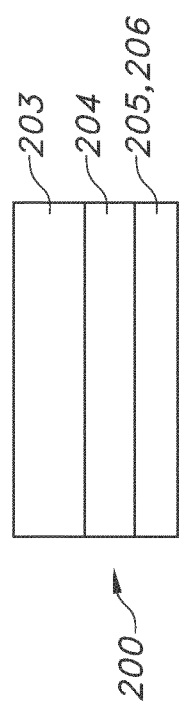

The schematic drawings are not necessarily to scale.

DETAILED DESCRIPTION OF THE EMBODIMENTS

FIG. 1a schematically depicts supports 200-1 or 200-2 (collectively 2001 for the light source 100. Especially, the light source may comprise a solid state light source. Here, by way of example four light sources are depicted on two very schematically depicted embodiments of the support 200.

The support 200 comprises at least two support parts 210-1 or 210-2 (collectively 2101. In variant I, there are two support parts, which are (virtually) separated by the dashed vertical lines, thereby providing four (possible) support parts 210, including three (possible) further support parts 212. The first support part 211-1 or 211-2 (collectively 211) of the support parts 210 is configured to support the light source 100. In variant II, the support 200 comprises two further support parts 212. Variants I and II are provides as non-limiting examples.

The support 200 may further support electronics 400. The electronics 400 are physically coupled to one or more of the further support parts 212-1 or 212-2 (collectively 212) and in general functionally coupled to the light source 100 (functional coupling not shown). For instance, the electronics 400 may comprise a driver and/or the electronics 400 may further optionally comprise a communication device for control of the light source 100. The electronics may comprise further electronic components.

Especially, the support 200 comprises a metal-core printed circuit board (see also FIG. 1b). The support 200 with light source 100 may also be indicated as element. Such element may thus be a metal-core printed circuit board (including a (functionally coupled) solid state light source).

The variants I and II of the support on the left of the FIG. 1a may be planar. Hence, the first support part 211 and the associated second support part 212 (on the left of the FIG. 1a) may have a mutual angle of 180°.

Figure 1C:
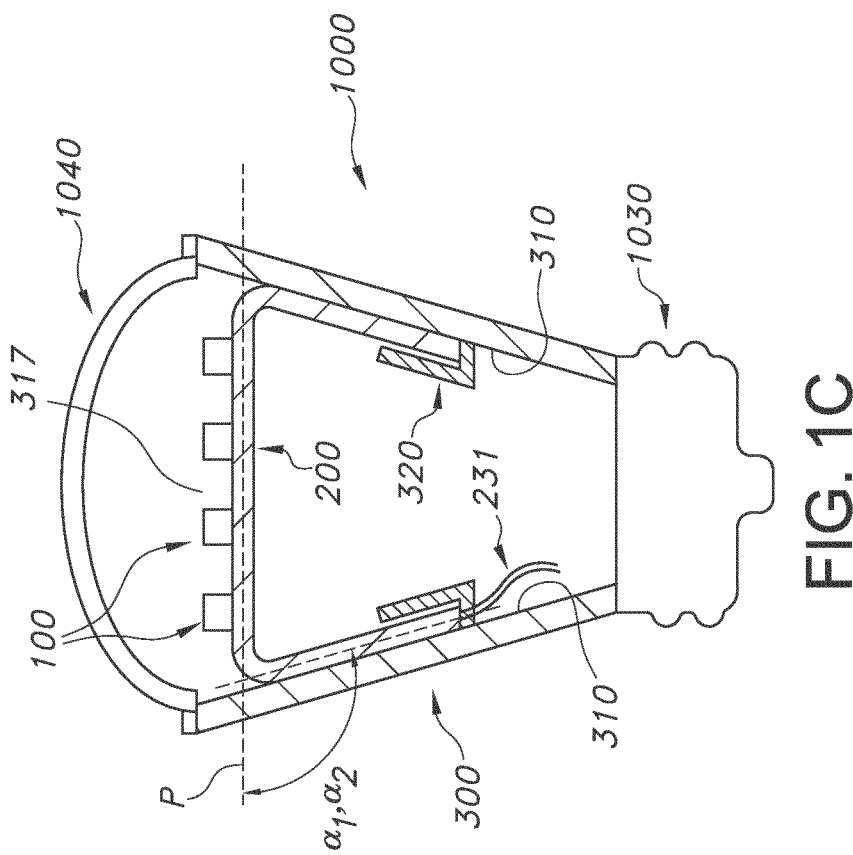

The supports 200 in the two schematically depicted variants may be bent (when configured in the light generating device), e.g. along the dashed lines, and one or more of the further support parts 212 may be configured against a (planar) housing wall 310 of a housing 300 (very schematically depicted only part of the housing is depicted; see for a further possible embodiment of a housing FIG. 1c). For both variants, this is indicated in the two right drawings. Here, it is shown that the support 200 comprises at least two support parts 210 which are configured bent relative to each other. The bending angle between the first support part 211 and an adjacent further support part 212 is indicated with $\alpha_1$. This angle is also indicated as first angle. The bending angle in variant I on the right is about 90°. The mutual angle of the first support part 211 and the adjacent second support part 212 has thus changed from 180° (on the left in FIG. 1a) to 270° (on the right in FIG. 1a); the bending angle $\alpha_1$ is 90°. As in the variant II there are two further support parts 212, there may be different bending angles (though this is not necessarily the case). These bending angles are indicated with $\alpha_1$ and $\alpha_{12}$. The former is the bending angle between the first support part 211 and a further support part 212; the latter is, in this schematically depicted embodiment, the bending angle between two (adjacent) further support parts 212. As indicated above, the bending angle $\alpha_1$ between the first support part 211 and an associated further support part 212 is in general also not 0°, but in general within the range of larger than 0° and equal to or smaller than 180°. In specific embodiments, the bending angle is larger than 45°, such as equal to or larger than 60°, though smaller values may also be possible. A bending angle $\alpha_{12}$ between two (adjacent) further support parts may be selected from the range of 0-360°, including in embodiments 180°. This can also be seen in FIG. 1a, wherein the bending angle $\alpha_{12}$ between two (adjacent) further support is 180° (i.e. a mutual angle of 360°) in variant I (on the right), and the bending angle $\alpha_{12}$ between two (adjacent) further support is 45° (i.e. a mutual angle of 225°) in variant II (on the right).

As schematically depicted, at least one of the at least two support parts 210 is configured in thermal contact with the housing wall 310, more especially at least one of the one or more further support parts 212 is configured in thermal contact with the housing wall 310. As indicated above, thermal contact may especially be achieved when there is physical contact. In both schematically depicted embodiments, (at least one of) the further support part(s) 212 is in physical contact with the housing wall 310.

Referring to variant II, the support 200 comprises at least two further support parts 212. A further support part 212 directly associated to the first support part 211 is in thermal contact with the housing wall 310. Yet, a further support part 212 not directly associated to the first support part 211 but associated to the further support part 212 directly associated to the first support part 211 is functionally coupled to the electronics 400. Hence, in embodiments, the at least two further support parts 212 may comprise a first further support part and a second further support part. The first further support part is directly associated to the first support part 211 (and directly associated to the second further support part). The second further support part is directly associated to the first further support part and not to the first support part 211. Especially, the first further support part is in thermal contact with the housing wall 310, and the second further support part is functionally coupled to the electronics 400. Note that all three support parts 210 have bending angles. These angles may in specific embodiments be selected from the range of larger than 0° and equal to or smaller than 180°, such as selected from the range of 15-165°, such as 30-145° for the bending angle $\alpha_1$, but may be different (or the same) for bending angles $\alpha_{12}$ between further support parts 212.

Reference 231 refers to electrical conductors, e.g. for functionally coupling the support 200, more especially the PCB, to a source of electrical power (not depicted).

At least part of the support 200 between the light source 100 and the housing wall is thermally conductive. For instance, when using a MCPCB, the support may include a metal layer that is thermally conductive, such as an Al or a Cu layer.

As indicated above, the support 200 may comprise a metal-core printed circuit board. Very schematically, an embodiment is depicted in FIG. 1*b* in cross-sectional view. Here, reference 203 refers to a copper layer which may provide one or more electrically conductive tracks for the light source(s). Reference 204 refers to a dielectric layer and reference 206 refers to a metal layer, such as Cu or Al, which is used as metal core. Optionally, in embodiments a further dielectric layer on the metal layer may be available (by which the dielectric layer may be sandwiched between dielectric layers).

FIG. 1*c* further schematically depicts an embodiments of a light generating device 1000. The light generating device 1000 comprises the light source 100, the support 200 for the light source 100, and the housing 300 comprising the housing wall 310.

Figure 1D:
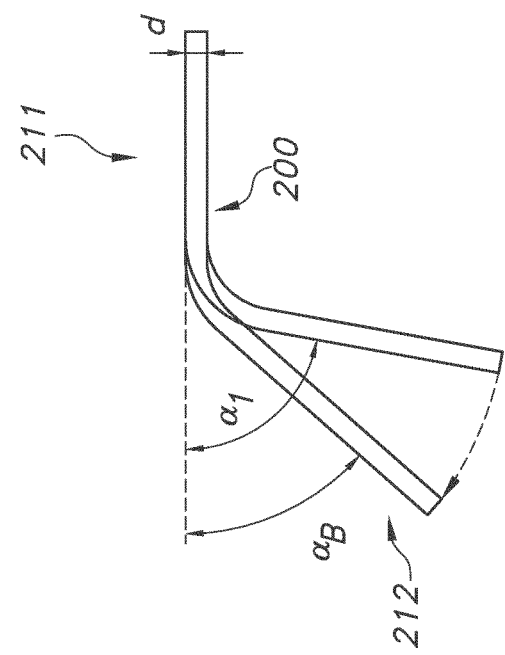

FIG. 1*c* is e.g. a cross-sectional view of a conically or (square) pyramidal shaped housing 300. In specific embodiments, the first support part 211 and the further support part 212 are configured under a first angle $\alpha_1$ larger than a predefined bent angle $\alpha_B$ (see also FIG. 1*d*). As schematically depicted, the housing wall 310 defines an opening 317, wherein the first support part 211 is configured at the opening 317. The housing wall 310 and a plane P parallel to the opening 317 define a second angle $\alpha_2$ larger than the predefined bent angle $\alpha_B$ (see also FIG. 1*d*). In specific embodiments, the first angle $\alpha_1$ may be selected from the range of 0.5-20°, such as 2-10° larger than a predefined bent angle $\alpha_B$.

Reference 320 indicates one or more stop and/or fixating elements. In this way, the position of the support 200 can be defined and/or the support 200 can be fixated.

Reference 1030 indicates a lamp cap, like e.g. an E27 cap (of course other caps may also be possible). Reference 1040 indicates a light transmissive window, such as e.g. of PMMA or PC.

Reference 1*d* schematically depicts aspects in relation to the bending angle $\alpha_1$ and the bent angle $\alpha_B$. As indicated on https://www.thefabricator.com/thefabricator/article/bending/bending-basics-the-hows-and-whys-of-springback-and-springforward, a bending angle is different from a bent angle. This is related to springback, as known to a person skilled in the art. Springback may occur when the material angularly tries to return to its original shape after being bent. When fabricating on the press brake, an operator may overbend to the bending angle, which is angularly past the required bent angle, compensating for the springback. Overbending to the bending angle allows the desired bent angle to be attained when the part is released from pressure (see FIG. 1*d*). The tensile strength and thickness of the material, type of tooling, and the type of bending influence springback, as known to a person skilled in the art. Reference d indicates the thickness of the support 200. In the case of a MCPB, the thickness may e.g. be in the range of about 0.5-2.0 mm.

Figure 2A:
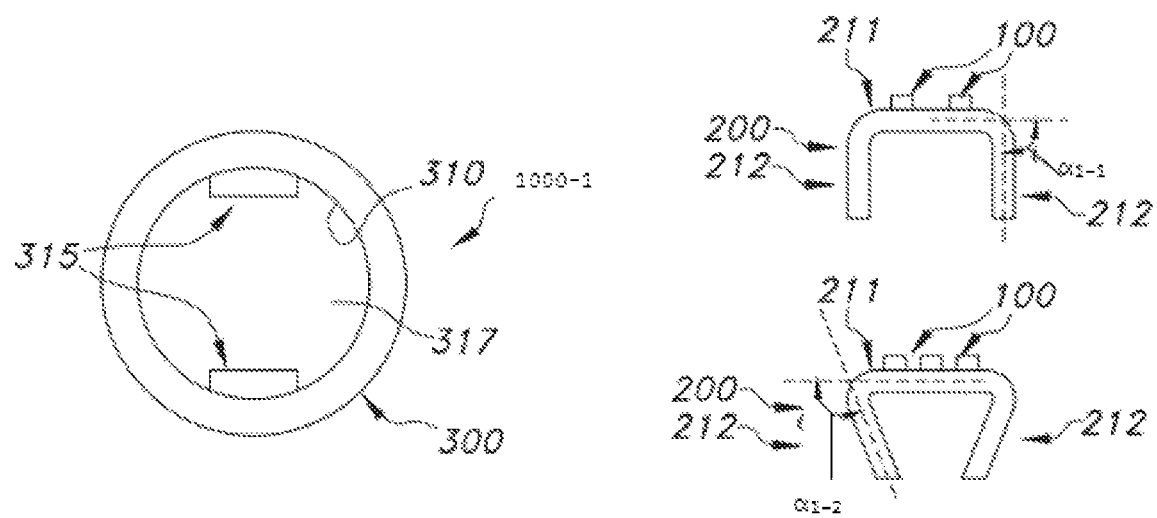
FIGS. 2a-2b schematically depict some further embodiments.
Figure 2B:
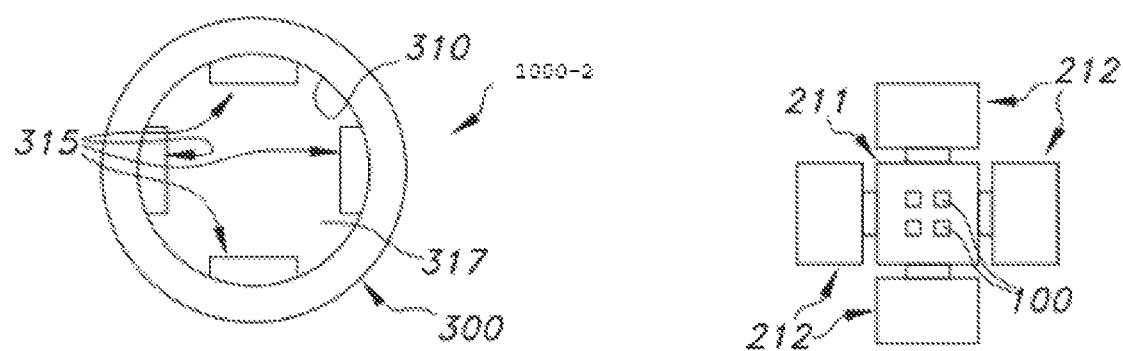

FIGS. 2*a* and 2*b* schematically depict embodiments and variants wherein the housing wall 310 comprises an internal planar contact part 315 for light generating device 1000-1 and 1000-2 (collectively 1000), wherein the further support part 212 can be arranged in physical contact with the internal planar contact part 315. In FIGS. 2*a* and 2*b* on the left side a cross-section of a circular housing 300 is depicted, wherein two and four internal planar contact parts 315 are available. Other number of internal planar contact parts 315 may of course also be possible. FIG. 2*a* on the right shows two cross-sections or side views of two possible bent supports 200, each having a single first support part 211 and two further support parts 212, which may be configured in the housing. Note that in FIG. 2*a* on the left a cross-sectional view is shown, and on the right a side view or cross-sectional view in a plane perpendicular to the cross-sectional view of the left drawing. In FIG. 2*b*, on the right a top view (or cross-sectional view) of an unbent support 200 is schematically depicted, which may be after folding, configured in the housing 300 on the left.

Figure 3A:
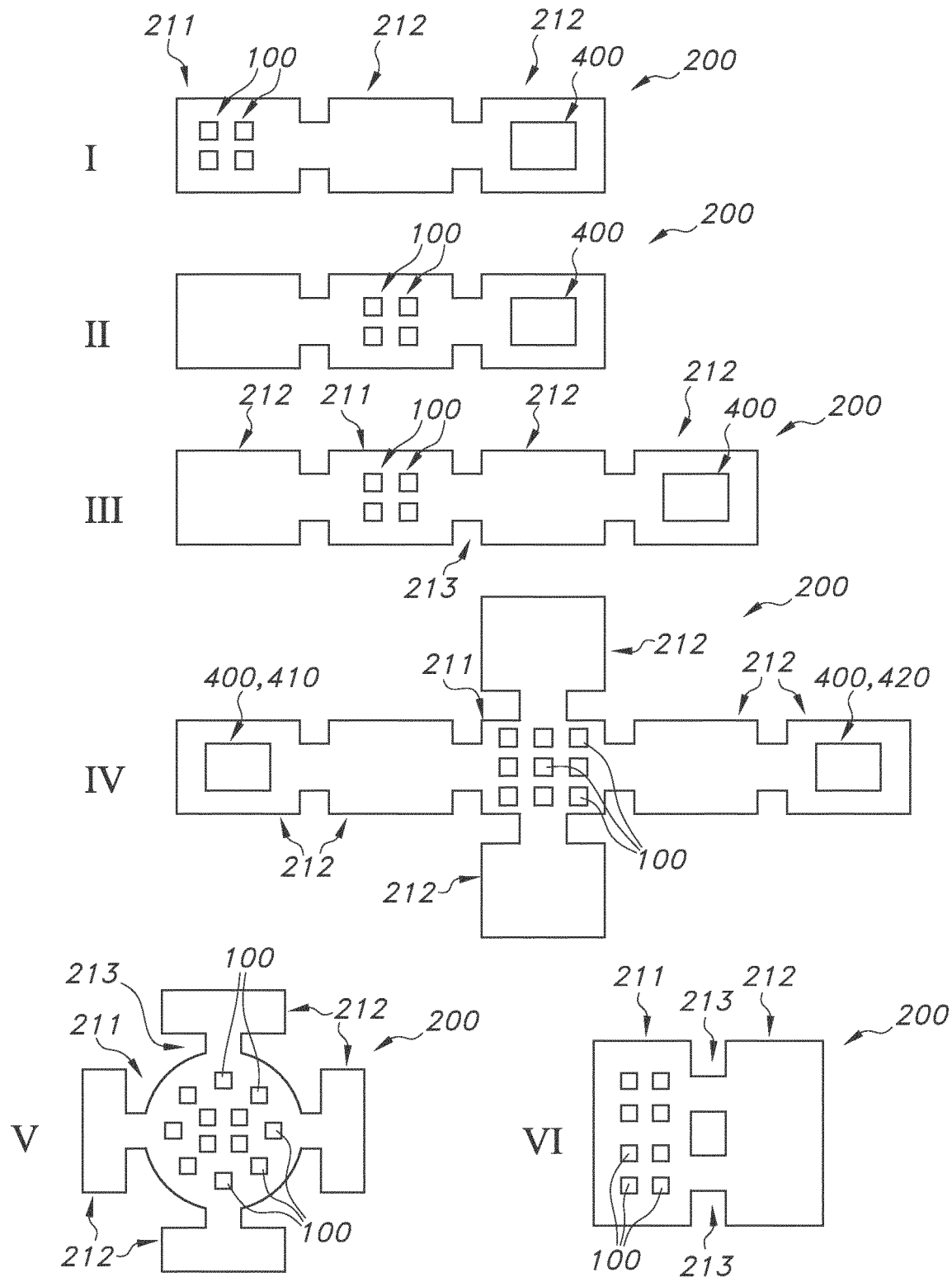
FIGS. 3a-3d schematically depict yet some further embodiments.

As indicated above, FIG. 1*c* schematically depicts that a plurality of support parts 212 may be configured in thermal contact with the housing wall 310; FIGS. 2*a*, 2*b*, but also FIG. 3*a* schematically depict embodiments and variants wherein the support 200 comprises a plurality of further support parts 212. One or more of these, or even all of the plurality of further support parts 212 may be configured in thermal contact with the housing wall 310.

With reference to FIG. 3*a*, the support may further support electronics 400. The electronics 400 are physically coupled to the further support part 212 and functionally coupled to the light source 100 (functional coupling not shown). For instance, the electronics 400 may comprise a driver 410 and/or the electronics 400 may further optionally comprise a communication device 420 for control of the light source 100. As schematically depicted in this embodiments, two different further support parts 412 comprise each different electronics 400. Further, as schematically depicted further support parts 412 without electronics are configured between the first support part 411 and the further support parts 412 comprising electronics 400. The intermediate further support parts 412 may be used for thermal contact with the housing wall (not depicted in this drawing). FIG. 3*a* schematically depict a plurality of variants. Here, by way of example electronics 400 are available. Especially, the electronics 400 are physically coupled to the further support part 212 and functionally coupled to the light source 100 (not shown). For instance, the electronics 400 comprise a driver 410 and/or the electronics 400 comprise a communication device 420 for control of the light source 100.

As schematically depicted in the variants in FIG. 3*a*, the electronics may be physically coupled to a subset of the plurality of further support parts 212, see variants I-III with electronics 400 on a single further support part 212, and variant IV wherein electronics 400 are on two support parts 212. Further, in the schematically depicted embodiments the support 200 comprises 2-8 further support parts 212, with two further support parts 212 in variants I-II and VI, three in variant III, four in variant V, and six in variant IV. Note that many more variants may be possible.

In variants II-V, at least two of the further support parts 212 are directly associated to the first support part 211. In variants I and VI there is only one further support part 212 directly associated to the first support part 211; in variant I there is also a further support part associated to the first support part 211 via another further support part 212.

In essentially all schematically depicted embodiments, a plurality of light sources 100 are functionally coupled to the (first support part 211 of the) support 200. Variant V schematically depicts an embodiment wherein the first support part 211 has a circular shape, and wherein the first support part 211 is configured to support the plurality of light sources 100.

Referring to FIG. 3*a*, all embodiments and variants depict a monolithic support 200, such as a monolithic MCPCB. By providing the right structure, and e.g. smaller and broader pieces, or e.g. indentations, bending may be facilitated.

The width of support between two support parts 210 may differ from the width of the support parts 210. This is indicated with reference 213. A smaller width may be beneficial for bending. Such connecting support piece (213), which is also part of the monolithic support 200, may also consist of more than one part. In other words, there may be more than one connecting support pieces 213 between support parts 210.

Figure 3B:
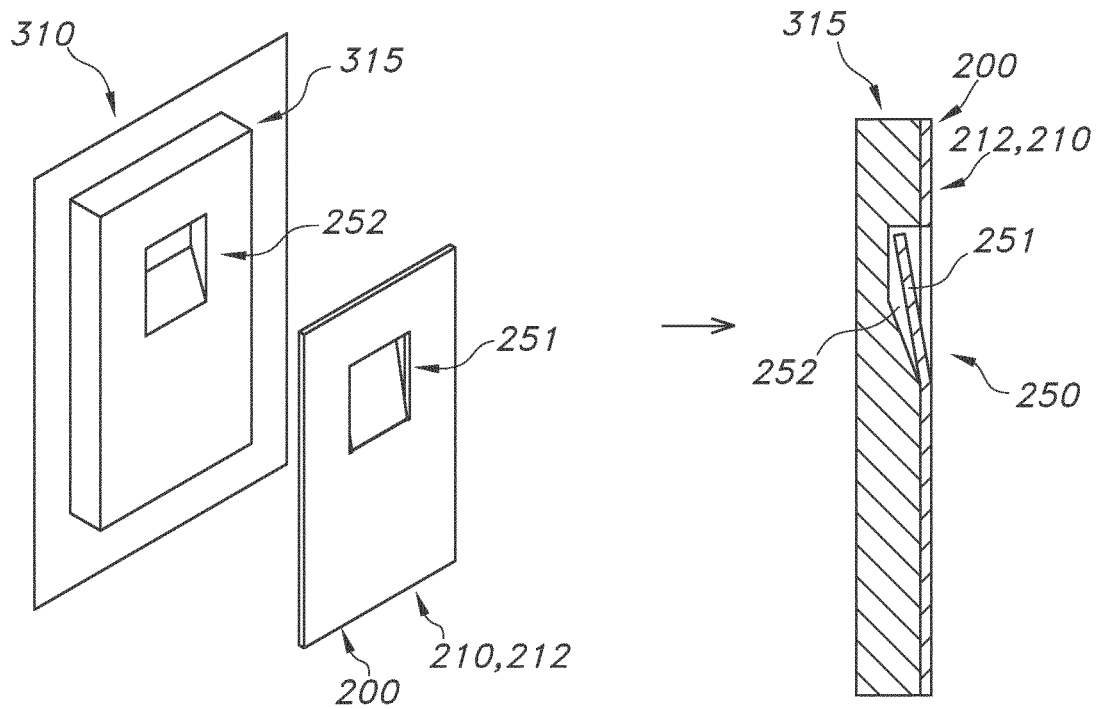

FIG. 3b also schematically depicts an embodiment wherein the housing and the support 200 may comprise one or more male-female connections 250. Here, the support 200 comprises one or more first mechanical connectors 251. The housing, here the housing wall 310, comprises one or more second mechanical connectors 252. The one or more first mechanical connectors 251 and the one or more second mechanical connectors 252 provide the one or more male-female connections 250.

Amongst others with the above embodiments, it is possible to produce the light generating device 1000 as defined herein, with a method comprising: (a) providing a light source 100, a support 200 for the light source 100, and a housing 300 comprising a housing wall 310, wherein the support 200 comprises at least two support parts 210 which are bendable relative to each other, wherein a first support part 211 of the at least two support parts 210 is configured to support the light source 100; and (b) bending the at least two support parts 210, introducing one or more of the at least two support parts 210 in the housing wall 310, fixating the support 200 to the housing 300, and configuring at least one further support part 212 in thermal contact with the housing wall 310, wherein at least part 206 of the support 200 between the light source 100 and the housing wall is thermally conductive.

Figure 3C:
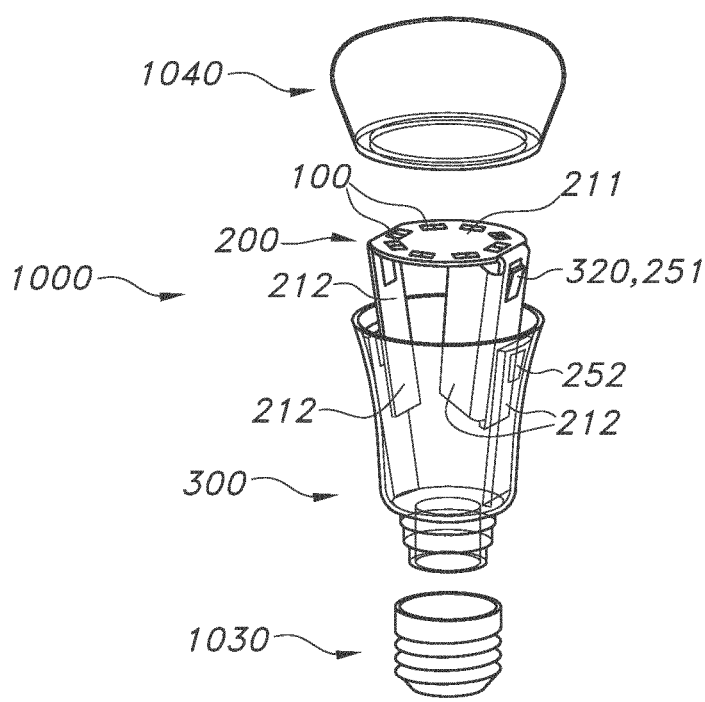
Figure 3D:
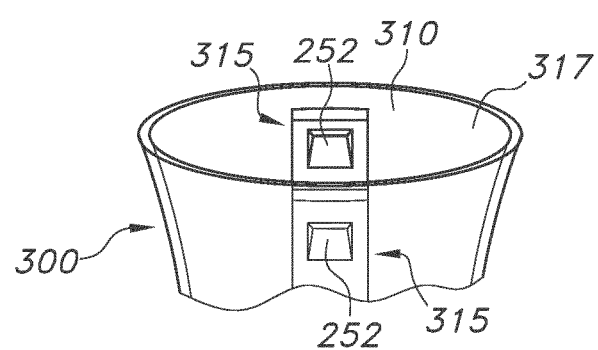

FIG. 3c schematically depicts an embodiment of a light generating device 1000 showing a number of embodiments and variants described above. FIG. 3d schematically depicts a perspective top view of the opening 317, here the internal planar contact part 315 with second mechanical connector 252 at the most remote internal side of the housing wall 310 is depicted. Likewise, this schematically depicted at the internal side of the housing wall 310 closer to the viewer, indicated with the thinner drawn lines.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising:
   a solid-state light source;
   a thermally conductive monolithic support supporting the light source, the support defining opposed first and second major surfaces, the support having a first support part, a second support part provided at an angle to the first support part, and a third support part provided at an angle to the first support part, with the first support part configured to support the light source;

a housing comprising a housing wall; and electronics supported by the third support part and functionally coupled to the light source, wherein the second support parts is in direct contact with the first support part and in thermal contact with the housing wall, the third support part is in direct contact with the second support part and not to the first support part, and the light source and the electronics are arranged on the first major surface.

2. The light generating device according to claim 1, wherein the the support comprises a metal-core printed circuit board.

3. The light generating device according to claim 1, wherein the housing wall comprises an internal planar contact part, wherein the second support part is in physical contact with the internal planar contact part.

4. The light generating device according to claim 1, the support comprises one or more first mechanical connectors, the housing comprises one or more second mechanical connectors, and the first and the second mechanical connectors providing male-female connections.

5. The light generating device according to claim 1, wherein the electronics further comprise a communication device for control of the light source.

6. The light generating device according to claim 1, the second support part comprising a plurality of the second support parts indirect contact with the first support part and in thermal contact with the housing wall.

7. The light generating device according to claim 1, wherein more first further support parts are in direct contact with the first support part and in thermal contact with the housing wall, and none of the second support parts supports a light source or electronics.

8. A method of producing the light generating device according to claim 1, the method comprising:

providing a light source, a thermally conductive support for the light source, and a housing comprising a housing wall, wherein the support comprises at least three support parts which are bendable relative to each other, wherein a first support part of the at least three support parts is configured to support the light source;

bending the at least three support parts;

introducing one or more of the at least three support parts in the housing wall;

fixating the support to the housing; and configuring at least one of support parts in thermal contact with the housing wall.

9. The light generating device according to claim 1, wherein the first support part and the second support part define a first angle $\alpha_1$ is selected from the range 35-145°.

10. The light generating device according to claim 9, wherein the housing wall defines an opening, wherein the first support part is proximate the opening, and the housing wall and a plane P parallel to the opening define a second angle $\alpha_2$.

11. The light generating device according to claim 1, wherein the first support part and the the second support part are bent relative to each other, and wherein the second support part and the third support part are configured bent relative to each other.

12. The light generating device according to claim 11, comprising the second support parts which are directly associated to the first support part and which is configured in thermal contact with the housing wall.

13. The light generating device according to claim 11, wherein at least two of the second support parts are in direct contact with the first support part.

14. The light generating device according to claim 11, the solid-state light source includes a plurality of light sources, the first support part has a circular shape, and wherein the first support supports the plurality of light sources.

* * * * *